(12) United States Patent
Hamade et al.

(10) Patent No.: US 6,816,422 B2
(45) Date of Patent: Nov. 9, 2004

(54) SEMICONDUCTOR MEMORY DEVICE HAVING MULTI-BIT TESTING FUNCTION

(75) Inventors: Kei Hamade, Hyogo (JP); Takashi Kono, Hyogo (JP); Kiyohiro Furutani, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 101 days.

(21) Appl. No.: 10/291,776

(22) Filed: Nov. 12, 2002

(65) Prior Publication Data
US 2003/0210594 A1 Nov. 13, 2003

(30) Foreign Application Priority Data
May 13, 2002 (JP) ........................................ 2002-137083

(51) Int. Cl.[7] .............................. G11C 7/00; G11C 8/00
(52) U.S. Cl. .................. 365/201; 365/365; 365/189.07; 365/189.08; 365/233
(58) Field of Search ........................... 365/201, 189.07, 365/189.08, 233

(56) References Cited

U.S. PATENT DOCUMENTS

| | | | | |
|---|---|---|---|---|
| 4,899,313 A | * | 2/1990 | Kumanoya et al. | ......... 365/201 |
| 5,587,950 A | * | 12/1996 | Sawada et al. | ............. 365/201 |
| 5,724,366 A | * | 3/1998 | Furutani | ..................... 365/201 |
| 5,867,439 A | * | 2/1999 | Asakura et al. | ............. 365/201 |
| 6,166,989 A | * | 12/2000 | Hamamoto et al. | ......... 365/233 |
| 6,650,582 B2 | * | 11/2003 | Matsumoto et al. | ........ 365/201 |
| 6,687,174 B2 | * | 2/2004 | Maruyama et al. | ......... 365/201 |

FOREIGN PATENT DOCUMENTS

| | | |
|---|---|---|
| JP | 04-351798 | 12/1992 |
| JP | 11-16391 | 1/1999 |

\* cited by examiner

*Primary Examiner*—Trong Phan
(74) *Attorney, Agent, or Firm*—McDermott Will & Emery LLP

(57) ABSTRACT

In a multi-bit test, an I/O combiner degenerates data of a plurality of bits read from a memory cell array to first to fourth data bus pairs in parallel and outputs the degenerated data to a fifth data bus. A read amplifier compares a logic level of the degenerated data received from the I/O combiner with a logic level of expected value data. If the logic level of the degenerated data coincides with the logic level of the expected value data, the read amplifier determines that data write and read to and from the plurality of bits have been normally performed. As a result, a semiconductor memory device can detect a word line defect in the multi-bit test.

7 Claims, 14 Drawing Sheets

F I G. 1
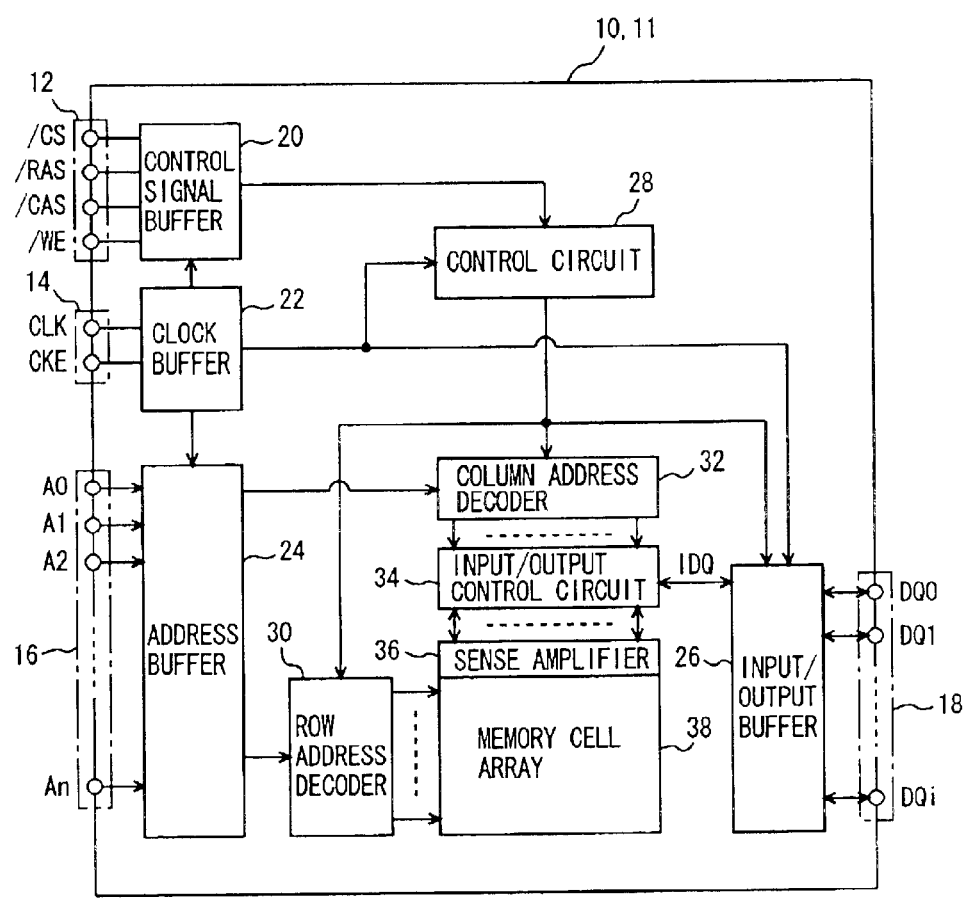

FIG. 17
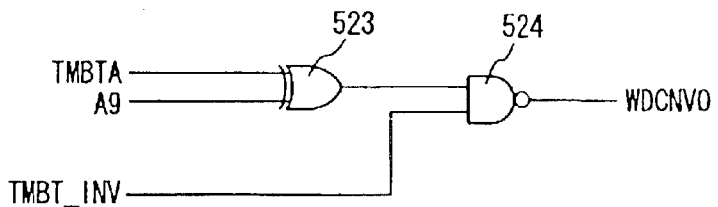
FIG. 18
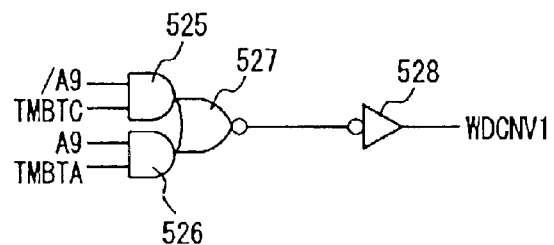
FIG. 19
|  | TMBTA | TMBTC | A9 | /A9 | WDCNV0 | WDCNV1 |
|---|---|---|---|---|---|---|
| CASE 1 | L | H | H | L | L | H |
| CASE 2 | L | H | L | H | H | L |
| CASE 3 | H | L | H | L | H | H |
| CASE 4 | H | L | L | H | L | L |

SEMICONDUCTOR MEMORY DEVICE HAVING MULTI-BIT TESTING FUNCTION

BACKGROUND OF THE INVENTION

1. Field of the Invention

The present invention relates to a semiconductor memory device, and more particularly to a semiconductor memory device having a multi-bit testing function.

2. Description of the Background Art

In a semiconductor memory device wafer test, a multi-bit test is performed so as to increase the number of wafers which can be tested by one tester. In this multi-bit test, a plurality of bits are degenerated to thereby decrease the number of input/output terminals employed in the test. In case of a semiconductor memory device which functions as a word organization of "×16", for example, four bits are degenerated to one bit by using a multi-bit test and a test data write/read test is performed to four input/output terminals, whereby a test can be performed to all memory cells.

The numbers of drivers and comparator pins to be provided in a tester employed for a test are determined according to the specification of the tester. Therefore, if the number of input/output terminals necessary to measure one device using a multi-bit test decreases, it is possible to increase the number of devices which can be simultaneously measured and to thereby enhance testing efficiency.

FIG. 24 is a functional block diagram for functionally describing data-read-related sections of a conventional semiconductor memory device which has a multi-bit testing function. It is noted that FIG. 24 typically shows only important sections related to data output in the semiconductor memory device.

Referring to FIG. 24, the semiconductor memory device includes a memory cell array MA100 which stores data, sense amplifiers SA100 to SA103 which detect data read from memory cell array MA100 to bit line pairs BL100 to BL103, input/output control circuits 711 to 714 which amplify the data read from sense amplifiers SA100 to SA103 to I/O line pairs LIO100 to LIO103, respectively, and switches S101 to S104 which selectively output the data received from input/output control circuits 711 to 714 in accordance with a multi-bit test mode signal TMBT whose logic level becomes H (logic high)-level in a multi-bit test mode, to data bus pairs NDB0 to NDB3 or TDB0 to TDB3, respectively.

Input/output control circuits 711 to 714 include preamplifiers/read data bus drivers which amplify the data read to I/O line pairs LIO100 to LIO103 and which output the amplified data to switches S101 to S104 during data read, respectively, and write amplifiers/write buffers which output the data received from switches S101 to S104 to I/O line pairs LIO100 to LIO103 during data write, respectively. In addition, sense amplifiers SA100 to SA103 write the write data received from the write amplifiers/write buffers of input/output control circuits 711 to 714 through I/O line pairs LIO100 to LIO103, to bit line pairs BL100 to BL103, respectively.

The semiconductor memory device also includes data bus pairs NDB0 to NDB3 which are connected to input/output control circuits 711 to 714 through switches S101 to S104 in a normal operation other than the multi-bit test mode (which normal operation will be referred to as "normal operation mode" opposed to the multi-bit test mode, hereinafter), and data bus pairs TDB0 to TDB3 which are connected to input/output control circuits 711 to 714 through switches S101 to S104 in the multi-bit test mode, respectively. Data bus pairs NDB0 to NDB3 are formed of data buses NDB0 and /NDB0, data buses NDB1 and /NDB1, data buses NDB2 and /NDB2 and data buses NDB3 and /NDB3 which transmit complementary data, respectively. Data bus pairs TDB0 to TDB3 is formed of data buses TDB0 and /TDB0, data buses TDB1 and /TDB1, TDB2 and /TDB2 and TDB3 and /TDB3 which transmit complementary data, respectively.

The semiconductor memory device further includes an I/O combiner 741 which degenerates and outputs the read data of four bits received from data bus pairs TDB0 to TDB3, a data bus pair RTDB which transmit the data degenerated by the I/O combiner 741, a read amplifier 721 which receives the data from data bus pair NDB0 and that from RTDB, selects one of the data in accordance with multi-bit test mode signal TMBT, amplifies the signal level of the selected data and outputs the data to a data bus pair RDAMP0, read amplifiers 722 to 724 which receives the data from data bus pairs NDB1 to NDB3, amplifies the signal levels of the data and outputs the data to data bus pairs RDAMP1 to RDAMP3, respectively, and output circuits 731 to 734 which receive the data outputted from read amplifiers 721 to 724 and output the data to the outside of the semiconductor memory device, respectively. Data bus pair RTDB is formed of data buses RTDB and /RTDB which transmit complementary data.

In a multi-bit test for this semiconductor memory device, before reading data from memory cell array MA100, data at the same logic level are written to the corresponding memory cells of memory cell array MA100. In a multi-bit test mode, the logic level of multi-bit test mode signal TMBT becomes H level and switches S101 to S104 connect input/output control circuits 711 to 714 to data bus pairs TDB0 to TDB3, respectively.

I/O combiner 741 degenerates the data of four bits received from data bus pairs TDB0 to TDB3. Namely, if the data of four bits received from data bus pairs TDB0 to TDB3 are all at the same logic level, it is determined that data write and read have been normally performed and H-level data and L (logic low)-level data are outputted to data bus pair RTDB and /RTDB, respectively. If the data of four bits are not at the same logic level, it is determined that data write and read have not been normally performed and H-level data is outputted to each of data bus pair RTDB and /RTDB.

In the multi-bit test mode, only read amplifier 721 is activated among read amplifiers 721 to 724. If the data received from data bus pair RTDB and /RTDB are at H level and L level, respectively, read amplifier 721 determines that data write and read have been normally performed and outputs an H-level signal to output circuit 731. If the data received from data bus pair RTDB and /RTDB are both at H level, read amplifier 721 determines that data write and read have not been normally performed and outputs an L-level signal to output circuit 731. Output circuit 731 outputs the received data to the outside of the semiconductor memory device. Other signals CKD, RDAI, /RDAI, RDAE and /RDAE received by read amplifiers 721 to 724 will be described later.

On the other hand, in a normal operation mode, the logic level of multi-bit test mode signal TMBT becomes L level and switches S101 to S104 connect input/output control circuits 711 to 714 to data bus pairs NDB0 to NDB3, respectively. Read amplifiers 721 to 724 amplify the data read from memory cell array MA100 to data bus pairs NDB0 to NDB3 and output the amplified data to output circuits 731 to 734, respectively.

FIGS. 25 and 26 are circuit diagrams for describing the circuit configuration of read amplifier 721. Referring to FIG. 25, read amplifier 721 includes an N-channel MOS transistor N101 which is connected to data bus NDB0 and a node RD and which has a gate receiving a signal /RDAI, an N-channel MOS transistor N102 which is connected to data bus /NDB0 and a node /RD and which has a gate receiving signal /RDAI, an N-channel MOS transistor N103 which is connected to node RD and data bus RDAMP and which has a gate receiving signal /RDAE, and an N-channel MOS transistor N104 which is connected to node /RD and data bus /RDAMP and which has a gate receiving signal /RDAE.

If signal /RDAI is at H level, N-channel MOS transistors N101 and N102 operate as an input circuit which takes in data on data bus pair NDB0 and /NDB0 into node pair RD and /RD. If signal /RDAE is at H level, N-channel MOS transistors N103 and N104 operate as an input circuit which takes in data on node pair RD and /RD into data bus pair RDAMP0 and /RDAMP0.

Read amplifier 721 also includes an N-channel MOS transistor N105 which is connected to data bus RDAMP0 and a ground node GND and which has a gate receiving signal CKD, and an N-channel MOS transistor N106 which is connected to data bus /RDAMP0 and ground node GND and which has a gate receiving signal CKD.

If signal CKD is at H level, N-channel MOS transistors N105 and N106 operate as an equalization circuit which equalizes data bus pair RDAMP and /RDAMP0 to L level.

Read amplifier 721 further includes an N-channel MOS transistor N107 which is connected to data bus RDAMP0 and a node ND102 and which has a gate connected to data bus /RDAMP0, an N-channel MOS transistor N108 which is connected to node ND102 and data bus /RDAMP0 and which has a gate connected to data bus RDAMP0, a P-channel MOS transistor P101 which is connected to data bus RDAMP0 and a node ND101 and which has a gate connected to data bus /RDAMP0, a P-channel MOS transistor P102 which is connected to node ND101 and data bus /RDAMP0 and which has a gate connected to data bus RDAMP0, a P-channel MOS transistor P103 which is connected to a power supply node Vcc and node ND101 and which has a gate receiving signal /RDAE, and an N-channel MOS transistor N109 which is connected to node ND102 and a ground node GND and which has a gate receiving signal RDAE.

If signal RDAE is at H level, N-channel MOS transistors N107 to N109 and P-channel MOS transistors P101 to P103 operate as a differential amplifier which amplifies a low amplitude signal, which is taken in from data bus pair NDB0 and /NDB0 into data bus pair RDAMP0 and /RDAMP0, to a full amplitude signal ranging from a power supply voltage level to a ground level.

Referring to FIG. 26, read amplifier 721 also includes a NAND gate 751 which receives the signal on data bus RTDB and multi-bit test mode signal TMBT, a NAND gate 752 which receives the signal on data bus /RTDB and multi-bit test mode signal TMBT, a NOR gate 753 which receives the outputs of NAND gates 751 and 752, an inverter 754 which inverts the output of NOR gate 753, an N-channel MOS transistor N110 which is connected to the output node of inverter 754 and node RD and which has a gate receiving a signal /MBI, and an N-channel MOS transistor N111 which is connected to the output node of NOR gate 753 and node /RD and which has a gate receiving signal /MBI.

NAND gates 751 and 752 are activated if multi-bit test mode signal TMBT is at H level. N-channel MOS transistors N110 and N111 operate as an input circuit which takes in the outputs of NAND gates 753 and inverter 754 into node pair RD and /RD, respectively.

Signal RDAE is a signal which activates the read amplifier during data read. Signal RDAI is a signal which logic level becomes H level if the semiconductor memory device turns into a data readable state in the multi-bit test mode. Signal CKD is a signal which equalizes data bus pair RDAMP0 and /RDAMP0 to L level before data is read to data bus pair RDAMP0 and /RDAMP0. Signal /MBI is a signal which logic level becomes H level after I/O combiner 741 outputs data to data bus pair RTDB and /RTDB.

In read amplifier 721, the logic level of signal CKD becomes H level before data is read and data bus pair RDAMP and /RDAMP0 are equalized to L level. And, in the normal operation mode, the logic levels of signals RDAE and RDAI become L level when data is read and data at low amplitude signal level is read from data bus pair NDB0 and /NDB0 to data bus pair RDAMP0 and /RDAMP0. Thereafter, the logic level of signal RDAE becomes H level and signals on data bus pair RDAMP0 and /RDAMP0 are amplified to full amplitude by a differential amplifier constituted by N-channel MOS transistors N107 to N109 and P-channel MOS transistors P101 to P103.

Meanwhile, in a multi-bit test mode, the logic level of multi-bit test mode signal TMBT becomes H level, and if the data received from data bus pair RTDB and /RTDB are at H level and L level, respectively, i.e., the logic levels of data of four bits read in parallel from memory cell array MA100 coincide with one another, then an L-level signal is outputted to the output node of NOR gate 753 and the logic level of the output of inverter 754 becomes H level. On the other hand, if the data received from data bus pair RTDB and /RTDB are both at H level, i.e., the logic levels of data of four bits read in parallel from memory cell array MA100 do not coincide, then an H-level signal is outputted to the output node of NOR gate 753 and the logic level of the output of inverter 754 becomes L level.

The logic levels of signals /MBI, /RDAI and /RDAE become H level, L level and H level, respectively, N-channel MOS transistors N110, N111, N103 and N104 are turned on, N-channel MOS transistors N101 and N102 are turned off, and data is read from data bus pair TDB and /TDB to data bus pair RDAMP0 and /RDAMP0. Thereafter, the logic level of signal RDAE becomes H level and the signals on data bus pair RDAMP0 and RDAMP0 are amplified to full amplitude by a differential amplifier constituted by N-channel MOS transistors N107 to N109 and P-channel MOS transistors P101 to P103.

Each of read amplifiers 722 to 724 are formed of the same constituent elements as those of read amplifier 721 except that NAND gates 751 and 752, NOR gate 753, inverter 754 and N-channel MOS transistors N110 and N111 are not provided. Since the other constituent elements of each of read amplifiers 722 to 724 are the same as those of read amplifier 721, they will not be repeatedly described.

FIG. 27 is a functional block diagram for functionally describing data-write-related sections of a conventional semiconductor memory device having a multi-bit testing function. It is noted that FIG. 27 typically shows only the important sections related to data input in the semiconductor memory device.

Referring to FIG. 27, the semiconductor memory device includes input circuits 771 to 774 which input write data from the outside of the semiconductor memory device, a write data bus driver 761 which receives the write data outputted from input circuit 771 and which selectively outputs the data to data bus pair NDB0 or WTDB in accordance with multi-bit test mode signal TMBT, a data bus pair WTDB which transmit the write data outputted from write data bus driver 761 to data bus pairs TDB0 to TDB3, and write data bus drivers 762 to 764 which receive the write data outputted from input circuits 772 to 774 and which output the write data to data bus pairs NDB1 to NDB3, respectively. Data bus pair WTDB is formed of data buses WTDB and /WTDB which transmit complementary data. Data bus WTDB is branched to data buses TDB0 to TDB3 and data bus /WTDB is branched to data buses /TDB0 to /TDB3.

Since the other circuit configuration is already described with reference to FIG. 24, it will not be repeatedly described herein.

In a multi-bit test mode, the write data is inputted only to input circuit 771. Write data bus driver 761 outputs the write data received from input circuit 771 to data bus pair WTDB in accordance with multi-bit test mode signal TMBT and the data outputted to data bus pair WTDB is transmitted to data bus pairs TDB0 to TDB3 which are branched from data bus pair WTDB.

Switches S101 to S104 connect data bus pairs TDB0 to TDB3 to input/output control circuits 711 to 714 in accordance with multi-bit test mode signal TMBT. The data at the same logic level are written from data bus pairs TDB0 to TDB3 to the memory cells of memory cell array MA100 through input/output control circuits 711 to 714 and sense amplifiers SA100 to SA103, respectively.

In a normal operation mode, write data bus drivers 761 to 764 receive the write data, which are inputted to input circuits 771 to 774, from input circuits 771 to 774 and output the write data to data bus pairs NDB0 to NDB3, respectively. Switches S101 to S104 connect data bus pairs NDB0 to NDB3 to input/output control circuits 711 to 714 in accordance with multi-bit test mode signal TMBT and data are written from data bus pairs NDB0 to NDB3 to the memory cells of memory cell array MA100 through input/output control circuits 711 to 714 and sense amplifiers SA100 to SA103, respectively.

According to the conventional semiconductor memory device, in the multi-bit test, test data at the same logic level are written in parallel to a plurality of bits and H-level data is outputted if the logic levels of the respective data read in parallel from the plurality of bits coincide and it is determined that these bits are normal. However, even if all the respective data are erroneously read, the logic levels of the respective data are consistent and H-level data is, therefore, outputted, as well. That is, the conventional semiconductor memory device cannot detect a word line defect (which is also referred to as an X line defect) from which all the data in the same row are erroneously read in the multi-bit test. For that reason, a test for separately detecting an X line defect in the normal operation mode other than the multi-bit test is performed in the conventional semiconductor memory device, with the result that test time disadvantageously increases.

Further, to solve the above-described problem, there is proposed inverting the logic levels of a part of data of a plurality of bits and writing the level-inverted data to the memory cell array. In this case, it is necessary to externally set, as a test mode, the logic levels of which data bits are to be inverted. If there are many terminals employed for the setting, the number of devices which can be simultaneously measured in a multi-bit test disadvantageously decreases and the testing efficiency of the multi-bit test eventually deteriorates.

SUMMARY OF THE INVENTION

The present invention is made to solve the above-mentioned problems. It is an object of the present invention to provide a semiconductor memory device which can perform a multi-bit test capable of detecting an X line defect.

It is another object of the present invention to provide a semiconductor memory device which can minimize the number of terminals employed for the setting of a test mode if a multi-bit test capable of detecting an X line defect is performed and which can maintain the testing efficiency of the multi-bit test.

According to the present invention, a semiconductor memory device includes: a memory cell array storing data; a determination circuit receiving expected value data for logic levels of read data of a plurality of bits read in parallel from the memory cell array, and determining whether the logic levels of the read data coincide with a logic level of the expected value data in a multi-bit test; and an output circuit outputting a determination result of the determination circuit.

It is preferable that the determination circuit determines whether a logic level of degenerated data obtained by degenerating the read data of the plurality of bits coincides with the logic level of the expected value data.

It is preferable that the semiconductor memory device further includes: an input circuit receiving degenerated data obtained by degenerating write data of a plurality of bits written in parallel to the memory cell array; a test mode control circuit generating a write data pattern signal for the write data of the plurality of bits on the basis of an internal test pattern setting signal generated internally; a write data inversion circuit inverting logic level of a part of the write data of the plurality of bits written in parallel to the memory cell array on the basis of the write data pattern signal in the multi-bit test; and a read data inversion circuit re-inverting the logic level of the data the logic level of which is inverted by the write data inversion circuit for the read data of the plurality of bits read in parallel from the memory cell array, and outputting the re-inverted read data of the plurality of bits to the determination circuit.

As described above, according to the semiconductor memory device of the present invention, the determination circuit determines whether the logic levels of data of a plurality of bits read in parallel from the memory cell array coincide with that of the expected value data in the multi-bit test. Therefore, even if all the read data are erroneously read such as an X line defect, it is possible to discriminate the defect.

Further, according to the semiconductor memory device of the present invention, the write data inversion circuit can invert the logic level of a part of data of a plurality of bits written in parallel to the memory cell array on the basis of the internal test pattern setting signal which is internally generated. Therefore, it is possible to enhance defect detection capability, to prevent the number of test target devices simultaneously measured in the test from decreasing, and to enhance testing efficiency as a whole.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a schematic block diagram showing the overall configuration of a semiconductor memory device according to the present invention;

FIG. 17 is a fourth circuit diagram showing the circuit configuration of the test mode control circuit shown in FIG. 13;

FIG. 18 is a fifth circuit diagram showing the circuit configuration of the test mode control circuit shown in FIG. 13;

FIG. 19 is a view which shows the logic level states of internal signals outputted from the test mode control circuit shown in FIG. 13;

DESCRIPTION OF THE PREFERRED EMBODIMENTS

Figure 2:
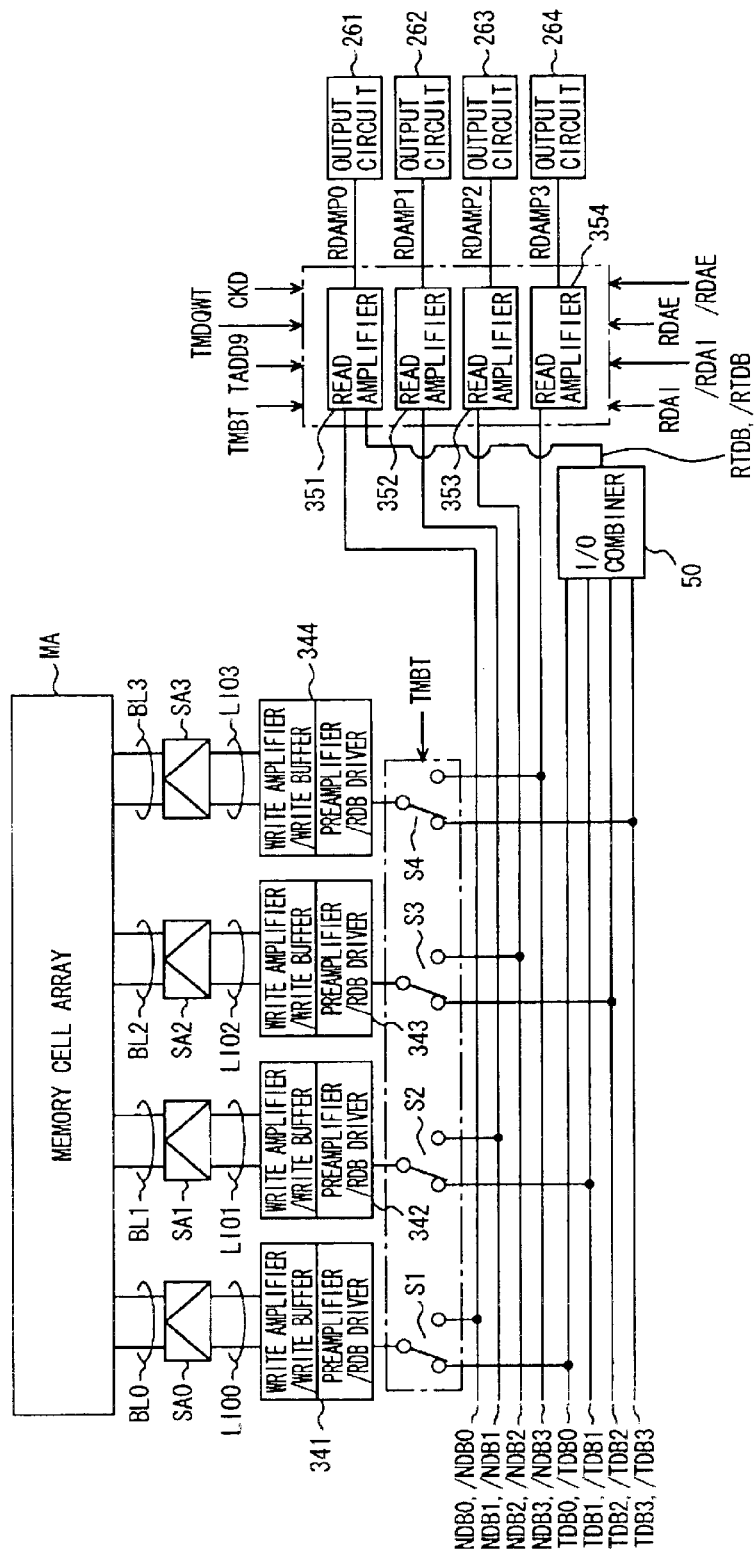
FIG. 2 is a functional block diagram for functionally describing data-read-related sections of the semiconductor memory device according to the first embodiment.

The embodiments of the present invention will be described hereinafter in detail with reference to the drawings. It is noted that the same or corresponding sections are denoted by the same reference symbols, respectively throughout the drawings and that they will not be repeatedly described.

First Embodiment

FIG. 1 is a schematic block diagram showing the overall configuration of a semiconductor memory device according to a first embodiment of the present invention.

Referring to FIG. 1, a semiconductor memory device 10 includes control terminals 12, clock terminals 14, address terminals 16, and data input/output terminals 18. Semiconductor memory device 10 also includes a control signal buffer 20, a clock buffer 22, an address buffer 24 and an input/output buffer 26. Semiconductor memory device 10 further includes a control circuit 28, a row address decoder 30, a column address decoder 32, an input/output control circuit 34, a sense amplifier 36 and a memory cell array 38.

It is noted that FIG. 1 typically shows only the important sections related to data input and output in semiconductor memory device 10.

Control signal terminals 12 receive the command control signals; i.e., a chip select signal /CS, a row address strobe signal /RAS, a column address strobe signal /CAS and a write enable signal /WE. Clock terminals 14 receive an external clock CLK and a clock enable signal CKE. Address terminals 16 receive address signals A0 to An (where n is a natural number).

Clock buffer 22 receives external clock signal CLK, generates an internal clock, and outputs the internal clock to control signal buffer 20, address buffer 24, input/output buffer 26 and control circuit 28. Control signal buffer 20 takes in and latches chip select signal /CS, row address strobe signal /RAS, column address strobe signal /CAS and write enable signal /WE in accordance with the internal clock received from clock buffer 22, and outputs the signals to control circuit 28. Address buffer 24 takes in and latches address signals A0 to An in accordance with the internal clock received from clock buffer 22, generates an internal address signal and outputs the internal address signal to row address decoder 30 and column address decoder 32.

Data input/output terminals 18 are terminal which exchange data read and written in semiconductor memory device 10 with the outside of the device. Data input/output terminals 18 receive data DQ0 to DQi (where i is a natural number) inputted from the outside during data write, and output data DQ0 to DQi to the outside during data read.

During data write, input/output buffer 26 takes in and latches data DQ0 to DQi in accordance with the internal clock received from clock buffer 22, and outputs internal data IDQ to input/output control circuit 34. During data read, input/output buffer 26 outputs internal data IDQ received from input/output control circuit 34 to data input/output terminal 18 in accordance with the internal clock received from clock buffer 22.

Control circuit 28 takes in the command control signals from control signal buffer 20 in accordance with the internal clock received from clock buffer 22, and controls row address decoder 30, column address decoder 32 and input/ output buffer 26 on the basis of the taken in command control signals. As a result, data DQ0 to DQi are read and written from and to memory cell array 38.

Row address decoder 30 selects a word line on memory cell array 38 corresponding to address signals A0 to An on the basis of an instruction from control circuit 28, and activates the selected word line by a word driver which is not shown. In addition, column address decoder 32 selects a bit line pair on memory cell array 38 corresponding to address signals A0 to An on the basis of an instruction from control circuit 28.

During data write, input/output control circuit 34 outputs internal data IDQ received from input/output buffer 26 to sense amplifier 36. Sense amplifier 36 precharges the bit line pair selected by column address decoder 32 with a power supply voltage Vcc or a ground voltage GND in accordance with the logic level of internal data IDQ. As a result, internal data IDQ is written to memory cells on memory cell array 38 which are connected to the word line activated by row address decoder 30 and to the bit line pair selected by column address decoder 32 and precharged by sense amplifier 36.

During data read, sense amplifier 36 precharges the bit line pair selected by column address decoder 32 with a voltage Vcc/2 before reading data, detects and amplifies a micro voltage change generated on the selected bit line pair to correspond to read data to determine the logic level of the read data, and outputs the read data to input/output control circuit 34. Input/output control circuit 34 outputs the read data received from sense amplifier 36 to input/output buffer 26.

Memory cell array 38 is a group of storage elements, i.e., memory cells, which store data and which are arranged in rows and columns, and is connected to row address decoder 30 through word lines corresponding to the respective rows and also connected to sense amplifier 36 through bit line pairs corresponding to the respective columns.

FIG. 2 is a functional block diagram for functionally describing data-read-related sections of semiconductor memory device 10 in the first embodiment. It is noted that FIG. 2 typically shows only the important sections related to data output in semiconductor memory device 10.

Referring to FIG. 2, semiconductor memory device 10 includes a memory cell array MA which stores data, sense amplifiers SA0 to SA3 which detect the data read from memory cell array MA to bit line pairs BL0 to BL3, input/output control circuits 341 to 344 which amplify the data read from sense amplifiers SA0 to SA3 to I/O line pairs LIO0 to LIO3, respectively, and switches S1 to S4 which selectively output the data received from input/output control circuits 341 to 344 to data bus pairs NDB0 to NDB3 or data bus pairs TDB0 to TDB3, respectively, in accordance with multi-bit test mode signal TMBT which logic level becomes H level in a multi-bit test mode.

Input/output control circuits 341 to 344 include preamplifiers/read data bus drivers which amplify the data read to I/O line pairs LIO0 to LIO3 and which output the amplified data to switches S1 to S4 during data read, and write amplifiers/write buffers which output the data received from switches S1 to S4 to I/O line pairs LIO0 to LIO3 during data write, respectively. In addition, sense amplifiers SA0 to SA3 write the write data received from write amplifiers/write data buffers of input/output control circuits 341 to 344 through I/O line pairs LIO0 to LIO3 during data write, respectively.

Further, semiconductor memory device 10 includes data bus pairs NDB0 to NDB3 which are connected to input/output control circuits 341 to 344 through switches S1 to S4, respectively, in a normal operation mode, and data bus pairs TDB0 to TDB3 which are connected to input/output control circuits 341 to 344 through switches S1 to S4 in a multi-bit test mode, respectively. Data bus pairs NDB0 to NDB3 are formed of data buses NDB0 and /NDB0, data buses NDB1 and /NDB1, data buses NDB2 and /NDB2 and data buses NDB3 and /NDB3 which transmit complementary data, respectively. In addition, data bus pairs TDB0 to TDB3 are formed of data buses TDB0 and /TDB0, data buses TDB1 and /TDB1, data buses TDB2 and /TDB2 and data buses TDB3 and /TDB3 which transmit complementary data, respectively.

Semiconductor memory device 10 further includes an I/O combiner 50 which degenerates and outputs the read data of four bits received from data bus pairs TDB0 to TDB3, a data bus pair RTDB which transmit the degenerated data degenerated by I/O combiner 50, a read amplifier 351 which receives the data from data bus pair NDB0 and RTDB, amplifies the signal level of the read data received from data bus pair NDB0 and outputs the data to data bus pair RDAMP0 in the normal operation mode, and which outputs a test result to data bus pair RDAMP0 in accordance with an expected value application test mode signal TMDQWT and an expected value signal TADD9 to be described later in the multi-bit test mode, read amplifiers 352 to 354 which receive the read data from data bus pairs NDB1 to NDB3, amplify the signal levels of the read data and output the data to data bus pairs RDAMP1 to RDAMP3, respectively, and output circuits 261 to 264 which receive the read data outputted from read amplifiers 351 to 354 and output the read data to the outside, respectively. Data bus pair RTDB is formed of data buses RTDB and /RTDB which transmit complementary data.

In semiconductor memory device 10 in the first embodiment, expected value signal TADD9 is employed to determine whether data write and read have been normally performed even if all the data in the same row are erroneously read such as an X line defect during the multi-bit test. Expected value signal TADD9 is the expected value of the read data in the multi-bit test and inputted to a predetermined address terminal when a read command is inputted from the outside.

In the multi-bit test mode, only read amplifier 351 is activated among read amplifiers 351 to 354, and read amplifier 351 outputs an H-level signal to output circuit 261 if expected value application test mode signal TMDQWT is at H level and the logic level of the degenerated data outputted from I/O combiner 50 coincides with that of expected value signal TADD9. If the logic level of the data outputted from I/O combiner 50 does not coincide with that of expected value signal TADD9, read amplifier 351 outputs an L-level signal to output circuit 261. It is noted herein that expected value application test mode signal TMDQWT is a signal which indicates that the semiconductor memory device is in an expected value application test mode for applying expected value signal TADD9 and determining whether the read data is correct.

For example, if H-level data is written as test data, expected value signal TADD9 is set at H level while expecting that H-level data is read and all the read data are at L level, then read amplifier 351 determines that data write/read has not been normally performed and outputs L-level data.

On the other hand, if L-level data is written as test data and expected value signal TADD9 is set at L level while expecting that L-level data is read and all the read data are at H level, for example, read amplifier 351 determines that data write/read has not been normally performed and outputs L-level data, as well.

Further, if H-level data is written as test data and a part of the read data includes L-level data, for example, read amplifier 351 determines that data write/read has not been normally performed and outputs L-level data, as well.

Other signals CKD, RDAI, /RDAI, RDAE and /RDAE which are received by amplifiers 351 to 354 will be described later.

As described above, by employing expected value data TADD9, it is possible to make a determination even if all the data have been erroneously read.

On the other hand, in the normal operation mode, the logic level of multi-bit test mode signal TMBT is L level and switches S1 to S4 connect input/output control circuits 341 to 344 to data bus pairs NDB0 to NDB3, respectively. Read amplifiers 351 to 354 amplify the data read from memory cell array MA to data bus pairs NDB0 to NDB3 and output the amplified data to output circuits 261 to 264, respectively.

Figure 3:
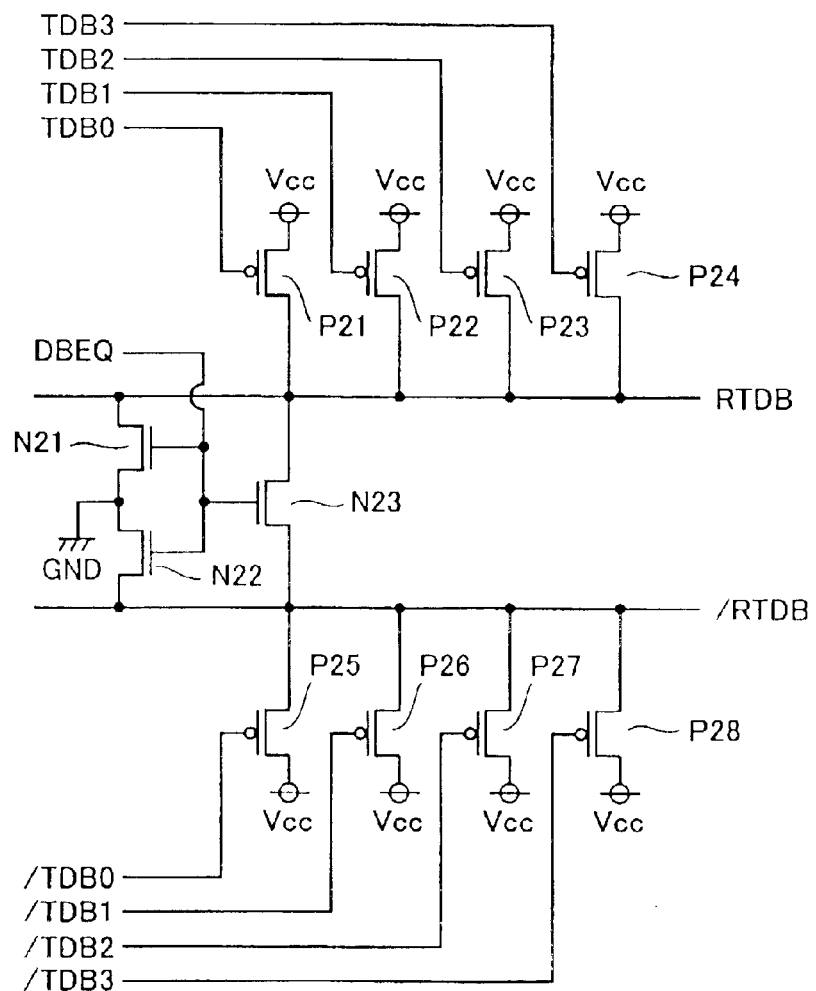
FIG. 3 is a circuit diagram for describing the circuit configuration of an I/O combiner shown in FIG. 2.

FIG. 3 is a circuit diagram for describing the circuit configuration of I/O combiner 50. Referring to FIG. 3, I/O combiner 50 includes a P-channel MOS transistor P21 which is connected to power supply node Vcc and data bus RTDB and which has a gate connected to data bus TDB0, a P-channel MOS transistor P22 which is connected to power supply node Vcc and data bus RTDB and which has a gate connected to data bus TDB1, a P-channel MOS transistor P23 which is connected to power supply node Vcc and data bus RTDB and which has a gate connected to data bus TDB2, and a P-channel MOS transistor P24 which is connected to power supply node Vcc and data bus RTDB and which has a gate connected to data bus TDB3.

I/O combiner 50 also includes a P-channel MOS transistor P25 which is connected to power supply node Vcc and data bus /RTDB and which has a gate connected to data bus /TDB0, a P-channel MOS transistor P26 which is connected to power supply node Vcc and data bus /RTDB and which has a gate connected to data bus /TDB1, a P-channel MOS transistor P27 which is connected to power supply node Vcc and data bus /RTDB and which has a gate connected to data bus /TDB2, and a P-channel MOS transistor P28 which is connected to power supply node Vcc and data bus /RTDB and which has a gate connected to data bus /TDB3.

I/O combiner 50 further includes an N-channel MOS transistor N21 which is connected to data bus RTDB and a ground node and which has a gate receiving a signal DBEQ, an N-channel MOS transistor N22 which is connected to data bus /RTDB and the ground node and which has a gate receiving signal DBEQ, and an N-channel MOS transistor N23 which is connected to data buses RTDB and /RTDB and which has a gate receiving signal DBEQ.

Signal DBEQ is a signal which equalizes data bus pair RTDB and /RTDB to L level before data is read by I/O combiner 50.

If the logic levels of the data received from data buses TDB0 to TDB3 are all H level, P-channel MOS transistors P21 to P24 are turned off and P-channel MOS transistors P25 to P28 are turned on. Therefore, I/O combiner 50 drives data bus RTDB to L level and drives data bus /RTDB to H level.

If the logic levels of the data received from data buses TDB0 to TDB3 are all L level, P-channel MOS transistors P21 to P24 are turned on and P-channel MOS transistors P25 to P28 are turned off. Therefore, I/O combiner 50 drives data bus RTDB to H level and drives data bus /RTDB to L level.

If the logic levels of the data received from data buses TDB0 to TDB3 include both H and L levels, some of P-channel MOS transistors P21 to P24 are turned on and some of P-channel MOS transistors P25 to P28 are also turned on. Therefore, I/O combiner 50 drives both of data buses RTDB and /RTDB to H level.

That is, I/O combiner 50 outputs L-level data and H-level data to data buses RTDB and /RTDB, respectively, if the logic levels of the read data read in parallel from memory cell array MA to data bus pairs TDB0 to TDB3 are all coincident, i.e., H level, outputs H-level data and L-level data to data buses RTDB and /RTDB, respectively, if the logic levels of the read data are all coincident, i.e., L level, and outputs H-level data to both data buses RTDB and /RTDB if the logic levels of the read data are not coincident.

Figure 4:
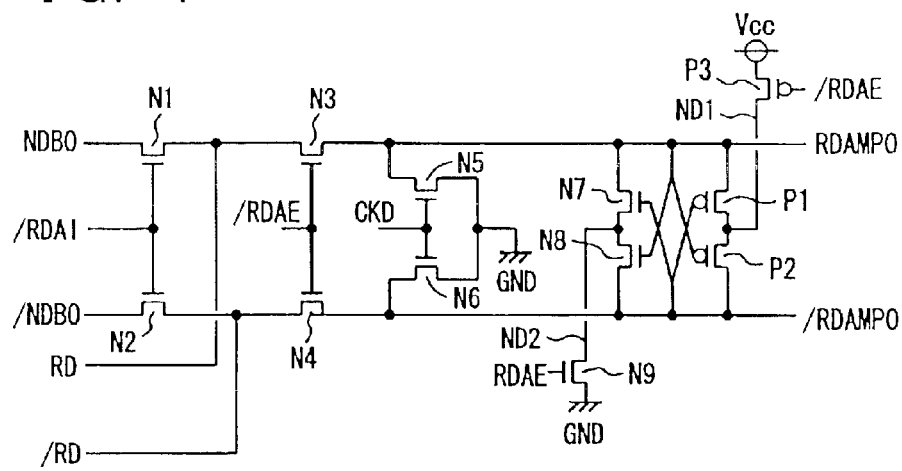
FIG. 4 is a first circuit diagram for describing the circuit configuration of a read amplifier shown in FIG. 2.

FIGS. 4 to 9 are circuit diagrams for describing read amplifier 351. Referring to FIG. 4, read amplifier 351 includes an N-channel MOS transistor N1 which is connected to data bus NDB0 and node RD and which has a gate receiving signal /RDAI, an N-channel MOS transistor N2 which is connected to data bus /NDB0 and node /RD and which has a gate receiving signal /RDAI, an N-channel MOS transistor N3 which is connected to node RD and data bus RDAMP0 and which has a gate receiving signal /RDAE, and an N-channel MOS transistor N4 which is connected to node /RD and data bus /RDAMP0 and which has a gate receiving signal /RDAE.

Signal RDAE is a signal which activates the read amplifier when data is to be read. Signal RDAI is a signal which logic level becomes H level if the semiconductor memory device is in a data readable state in the multi-bit test mode. If the logic level of signal /RDAI is at H level, N-channel MOS transistors N1 and N2 operate as an input circuit which takes in the data on data bus pair NDB0 and /NDB0 into node pair RD and /RD. In addition, if the logic level of signal /RDAE is at H level, N-channel MOS transistors N3 and N4 operate as an input circuit which takes in the data on node pair RD and /RD into data bus pair RDAMP0 and /RDAMP0.

Read amplifier 351 further includes an N-channel MOS transistor N5 which is connected to data bus RDAMP0 and ground node GND and which has a gate receiving signal CKD, and an N-channel MOS transistor N6 which is connected to data bus /RDAMP0 and ground node GND and which has a gate receiving signal CKD.

Signal CKD is a signal which equalizes data bus pair RDAMP0 and /RDAMP0 before data is read to data bus pair RDAMP0 and /RDAMP0. N-channel MOS transistors N5 and N6 operate as an equalization circuit which equalizes data bus pair RDAMP0 and /RDAMP0 to L level if the logic level of signal CKD is at H level.

Read amplifier 351 further includes an N-channel MOS transistor N7 which is connected to data bus RDAMP0 and a node ND2 and which has a gate connected to data bus /RDAMP0, an N-channel MOS transistor N8 which is connected to node ND2 and data bus /RDAMP0 and which has a gate connected to data bus RDAMP0, a P-channel MOS transistor P1 which is connected to data bus RDAMP0 and a node ND1 and which has a gate connected to data bus /RDAMP0, a P-channel MOS transistor P2 which is connected to node ND1 and data bus /RDAMP0 and which has a gate connected to data bus RDAMP0, a P-channel MOS transistor P3 which is connected to power supply node Vcc and node ND1 and which has a gate receiving signal /RDAE, and an N-channel MOS transistor N9 which is connected to node ND2 and ground node GND and which has a gate receiving signal RDAE.

N-channel MOS transistors N7 to N9 and P-channel MOS transistors P1 to P3 operate as a differential amplifier for amplifying the low amplitude signals taken in from data bus pair NDB0 and /NDB0 into data bus pair RDAMP0 and /RDAMP0 to full amplitude signals ranging from power supply voltage level to ground voltage level if signal RDAE is at H level.

Figure 5:
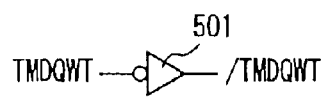
FIG. 5 is a second circuit diagram for describing the circuit configuration of the read amplifier shown in FIG. 2.

Referring to FIG. 5, read amplifier 351 further includes an inverter 501 which receives and inverts expected value application test mode signal TMDQWT and outputs an internal signal /TMDQWT.

Figure 6:
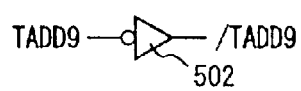
FIG. 6 is a third circuit diagram for describing the circuit configuration of the read amplifier shown in FIG. 2.

Referring to FIG. 6, read amplifier 351 further includes an inverter 502 which receives and inverts expected value signal TADD9 and outputs an internal signal /TADD9.

Figure 7:
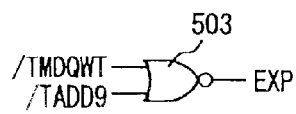
FIG. 7 is a fourth circuit diagram for describing the circuit configuration of the read amplifier shown in FIG. 2.

Referring to FIG. 7, read amplifier 351 further includes a NOR gate 503 which receives internal signals /TMDQWT and /TADD9 and outputs an internal signal EXP.

Figure 8:
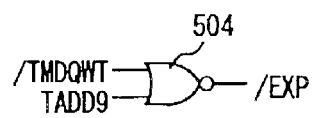
FIG. 8 is a fifth circuit diagram for describing the circuit configuration of the read amplifier shown in FIG. 2.

Referring to FIG. 8, read amplifier 351 further includes a NOR gate 504 which receives internal signal /TMDQWT and expected value signal TADD9 and outputs an internal signal /EXP.

NOR gates 503 and 504 are activated if expected value application test mode signal TMDQWT is at H level. If expected value signal TADD9 is at H level, NOR gate 503 outputs H-level internal signal EXP and NOR gate 504 outputs L-level internal signal /EXP. If expected value signal TADD9 is at L level, NOR gate 503 outputs L-level internal signal EXP and NOR gate 504 outputs H-level internal signal /EXP.

Figure 9:
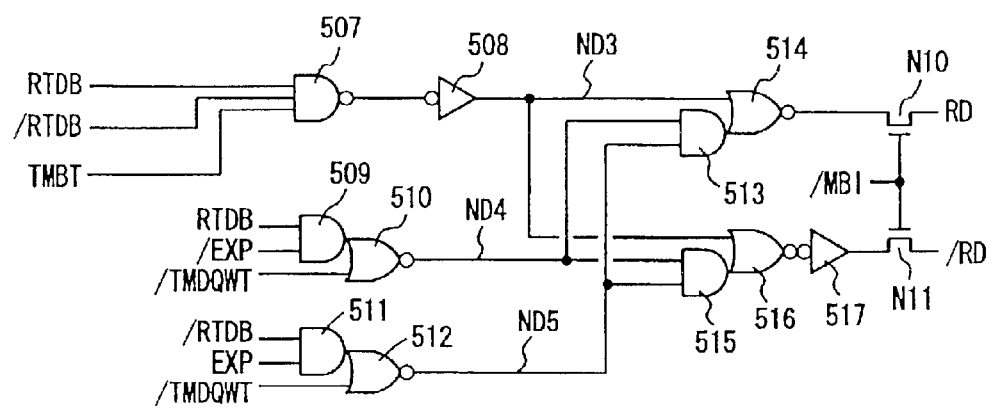
FIG. 9 is a sixth circuit diagram for describing the circuit configuration of the read amplifier shown in FIG. 2.

Referring to FIG. 9, read amplifier 351 further includes a NAND gate 507 which receives the signals on data bus pair RTDB and /RTDB and multi-bit test mode signal TMBT, and an inverter 508 which receives and inverts the output of NAND gate 507.

Read amplifier 351 also includes an AND gate 509 which receives the signal on data bus RTDB and internal signal /EXP, a NOR gate 510 which receives the output of AND gate 509 and internal signal /TMDQWT, an AND gate 511 which receives the signal on data bus /RTDB and internal signal EXP, and a NOR gate 512 which receives the output of AND gate 511 and internal signal /TMDQWT.

Read amplifier 351 further includes AND gates 513 and 515 which receives the outputs of NOR gates 510 and 512, a NOR gate 514 which receives the outputs of inverter 508 and AND gate 513, a NOR gate 516 which receives the outputs of inverter 508 and AND gate 515, and an inverter 517 which inverts the output of NOR gate 516.

Furthermore, read amplifier 351 includes an N-channel MOS transistor N10 which is connected to the output node of NOR gate 514 and node RD and which has a gate receiving signal /MBI, and an N-channel MOS transistor N11 which is connected to the output node of inverter 517 and node /RD and which has a gate receiving signal /MBI.

The operation of this read amplifier 351 will next be described.

Referring back to FIG. 4, in read amplifier 351, the logic level of signal CKD becomes H level and data bus pair RDAMP0 and /RDAMP0 are equalized to L level before data is to be read, and the logic levels of signals RDAE and RDAI become L level and the data at low amplitude signal level is read from data bus pair NDB0 and /NDB0 to data bus pair RDAMP0 and /RDAMP0 when data is to be read in the normal operation mode. Thereafter, the logic level of signal RDAE becomes H level and the signals on data bus pair RDAMP0 and /RDAMP0 are amplified to full amplitude by a differential amplifier constituted by N-channel MOS transistors N7 to N9 and P-channel MOS transistors P1 to P3.

Referring back to FIG. 9, in the multi-bit test mode, if the data received from data bus pair RTDB and /RTDB are at L level and H level, respectively, and expected value signal TADD9 is at H level, then the logic level of multi-bit test mode signal TMBT becomes H level, those of internal signals EXP and /EXP becomes H level and L level, respectively, and that of internal signal /TMDQWT becomes L level and the logic levels of the signals on nodes ND3, ND4 and ND5 become L level, H level and L level, respectively. Therefore, NOR gate 514 outputs an H-level signal and inverter 517 outputs an L-level signal. During data read, the logic level of signal /MBI becomes H level, N-channel MOS transistors N10 and N11 are turned on and an H-level signal and L-level signal are read to node pair RD and /RD, respectively.

Referring back to FIG. 4, during data read in the multi-bit test mode, signal RDAI is kept at H level, so that no data is read from data bus pair NDB0 and /NDB0 to node pair RD and /RD. The logic level of signal RDAE become L level and an H-level signal and an L-level signal are read from node pair RD and /RD to data bus pair RDAMP0 and /RDAMP0, respectively. Thereafter, the logic level of signal RDAE becomes H level and the signals on data bus pair RDAMP0 and /RDAMP0 are amplified to full amplitude by a differential amplifier constituted by N-channel MOS transistors N7 to N9 and P-channel MOS transistors P1 to P3.

Referring back to FIG. 9, if the data received from data buses RTDB and /RTDB are at H level and L level, respectively, and expected value signal TADD9 is at H level, then the logic levels of the signals on nodes ND3, ND4 and ND5 become L level, H level and H level, respectively. At this moment, therefore, the logic levels of the outputs of NOR gate 514 and inverter 517 become L level and H level, respectively, and an L-level signal and an H-level signal are taken in to data bus pair RDAMP0 and /RDAMP0, respectively.

If the data received from data bus pair RTDB and /RTDB are both at H level, the logic level of the signal at node ND3 becomes H level. In this case, therefore, the logic levels of the outputs of NOR gate 514 and inverter 517 become L level and H level, respectively, and an L-level signal and an H-level signal are taken in to data bus pair RDAMP0 and /RDAMP0, respectively, independently of expected value signal TADD9.

Each of read amplifiers 352 to 354 is formed of the same constituent elements as those of read amplifier 351 except that the circuits shown in FIGS. 5 to 9 are not provided. Since the other constituent elements of read amplifiers 352 to 354 are the same as those of read amplifier 351, they will not be repeatedly described herein.

Figure 10:
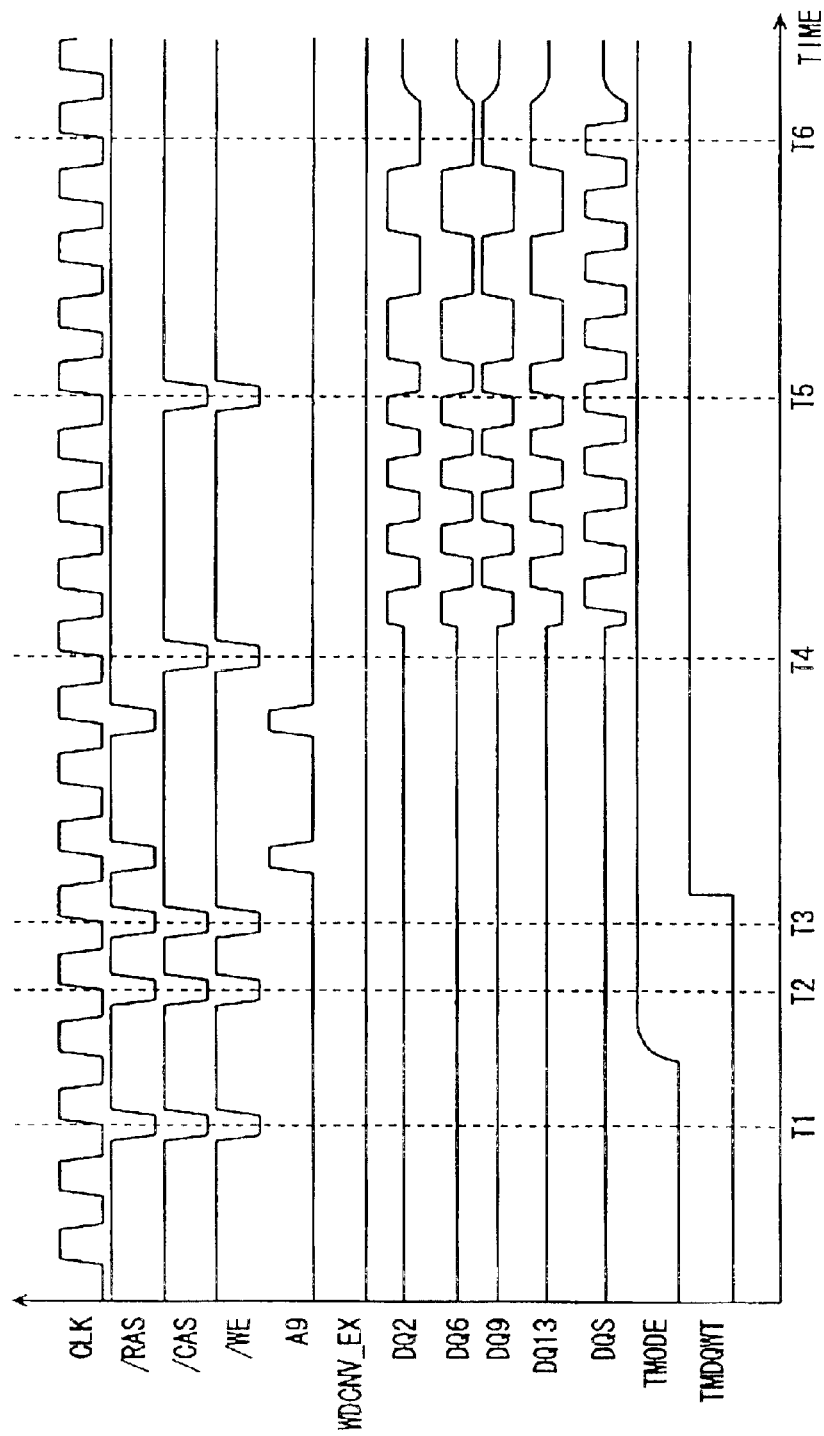
FIG. 10 is a first timing chart showing typical signal waveforms during a multi-bit test.
Figure 11:
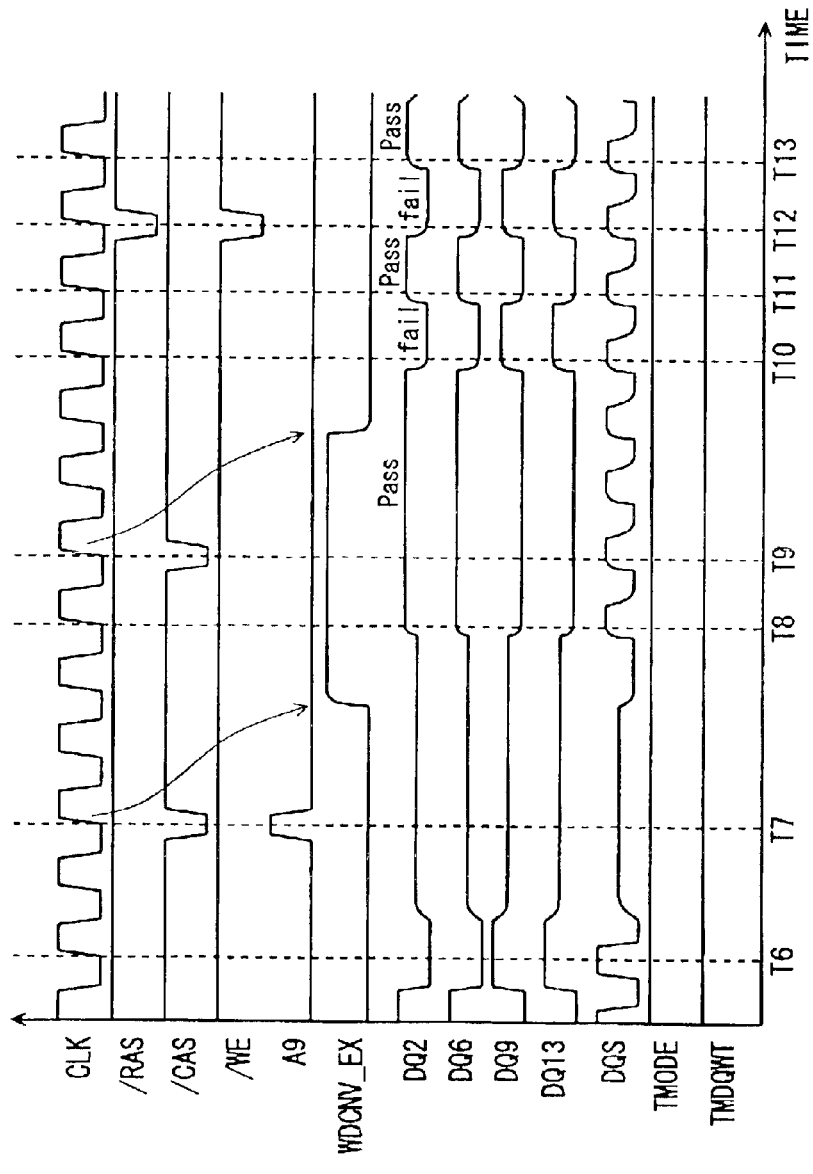
FIG. 11 is a second timing chart showing typical signal waveforms during the multi-bit test.

FIGS. 10 and 11 are timing charts which show typical signal waveforms in the multi-test bit mode.

Referring to FIG. 10, at timing T1, if row address strobe signal /RAS, column address strobe signal /CAS and write enable signal /WE all of which are at L level are inputted and a predetermined voltage is applied to a specific terminal, then the level of test mode signal TMODE becomes H level and semiconductor memory device 10 turns into a test mode.

Next, at timing T2, if row address strobe signal /RAS, column address strobe signal /CAS and write enable signal /WE all of which are at L level are inputted and a predetermined signal is inputted to a predetermined address terminal, then a multi-bit test mode is set.

At timing T3, if row address strobe signal /RAS, column address strobe signal /CAS and write enable signal /WE all of which are at L level are inputted and a predetermined signal is inputted to the other predetermined address terminal, then an expected value application test mode is set and the logic level of expected value application test mode signal TMDQWT becomes H level.

At timing T4, if the logic levels of row address strobe signal /RAS, column address strobe signal /CAS and write enable signal /WE become H level, L level and L level, respectively, then semiconductor memory device 10 turns into a write mode. With respect to, for example, data DQ2, for example, during timings T4 to T5, data all at H level are written from data input/output terminal 18 corresponding to data DQ2. During timings T5 to T6, H-level, L-level, H-level and L-level data are written from data input/output terminal 18 corresponding to data DQ2.

It is noted herein that data DQ2 is data obtained by degenerating data DQ0 to DQ3, data DQ6 is data obtained by degenerating data DQ4 to DQ7, data DQ9 is data obtained by degenerating data DQ8 to DQ11, and data DQ13 is data obtained by degenerating data DQ12 to DQ15.

Referring to FIG. 11, at timing T7, if the logic levels of row address strobe signal /RAS, column address strobe signal /CAS and write enable signal /WE become H level, L level and H level, respectively, then semiconductor memory device 10 turns into a read mode. At this timing, a voltage is applied to address terminal A9, the logic level of a signal WDCNV_EX becomes H level and expected value signal TADD9 of the output data is set at H level.

If so and the data written at timings T4 to T5 are read at timings T8 to T10, an H-level signal (indicating that data write/read has been normal) is outputted to the data input/output terminal corresponding to data DQ2 because the written data are all at H level.

At timing T9, when a read instruction for reading the data written at timings T5 to T6 is received, then no voltage is applied to address terminal A9, the logic level of a signal WDCNV_EX becomes L level and expected value signal TADD9 of the output data is set at L level.

If so and the data written at timings T5 and T6 are read at timings T10 to T13, then an L-level signal (indicating that data write/read has been abnormal), an H-level signal, an L-level and an H-level signal are sequentially outputted to the data input/output terminal corresponding to data DQ2 because the written data are at H level, L level, H level and L level, respectively.

In this way, by comparing the read data with the expected value data and outputting the comparison result, if all the data are erroneously read, an L-level signal is outputted, thereby making it possible to detect an X line defect.

As described above, according to semiconductor memory device 10 in the first embodiment, the expected value at the same logic level as that of the written test data is inputted as expected value data during data read so as to be employed to determine whether data write/read has been normally performed in the multi-bit test. Therefore, even if all the read data are erroneously read such as an X line defect, it is possible to discriminate the defect.

Accordingly, it is possible to omit a test which is separately performed to detect an X line defect and to shorten test time.

Second Embodiment

In the first embodiment, the logic levels of the data of a plurality of bits written in parallel to the memory cell array in the multi-bit test are the same at the same address.

In the second embodiment, a part of data of a plurality of bits written in parallel are internally inverted and test data can be written in a plurality of data patterns. In this case, it is necessary to input a setting signal from the outside if the logic level pattern of the write data (to be referred to as write data pattern hereinafter) is to be set. However, if the number of terminals employed for the setting increases, the number of simultaneously measured devices in a multi-bit test decreases, with the result that testing efficiency deteriorates. In the second embodiment, therefore, when a write data pattern is set, the number of terminals employed to designate the write data pattern is suppressed to a minimum of one terminal to prevent testing efficiency from deteriorating due to the decreased number of simultaneously measured devices.

Since the overall configuration of a semiconductor memory device 11 in the second embodiment is the same as that of semiconductor memory device 10 in the first embodiment, it will not be repeatedly described herein.

Figure 12:
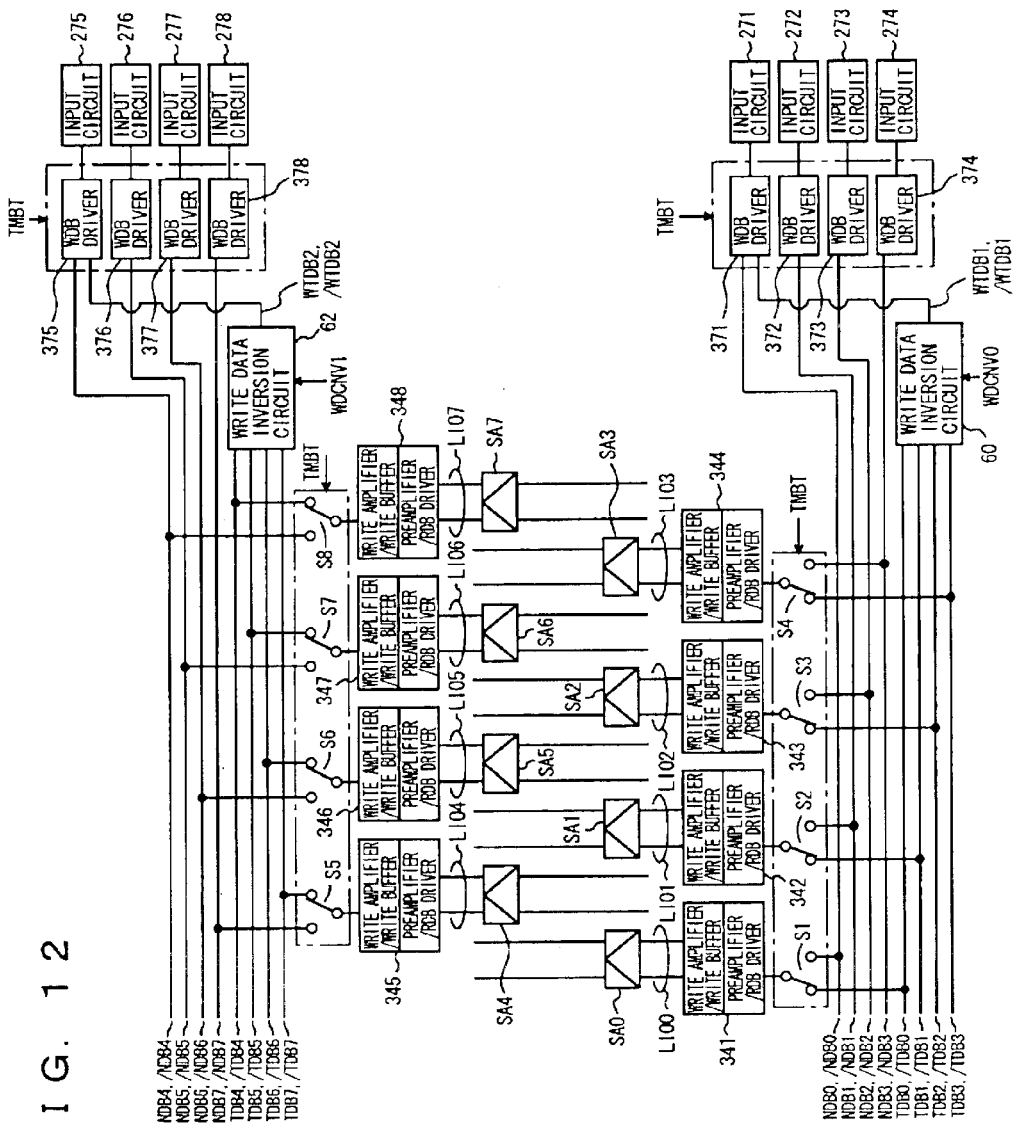
FIG. 12 is a first functional block diagram for functionally describing data-write-related sections of a semiconductor memory device according to a second embodiment.
Figure 13:
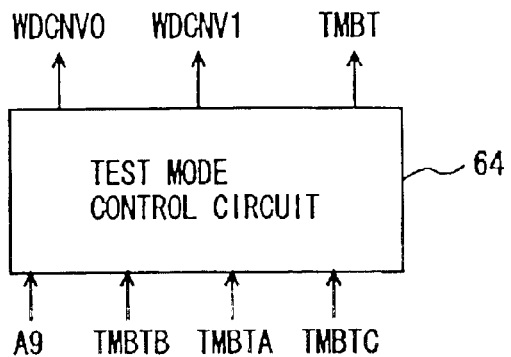
FIG. 13 is a second functional block diagram for functionally describing the data-write-related sections of the semiconductor memory device according to the second embodiment.

FIGS. 12 and 13 are functional block diagrams for functionally describing data-write-related sections of semiconductor memory device 11 in the second embodiment. It is noted that FIG. 12 typically shows only the important sections related to data input in semiconductor memory device 11.

Referring to FIG. 12, semiconductor memory device 11 includes input circuits 271 to 278 which input data from the outside of semiconductor memory device 11, a write data bus driver 371 which receives the data outputted from input circuit 271 and which selectively outputs the data to data bus pair NDB0 or a data bus pair WTDB1 in accordance with multi-bit test mode signal TMBT, write data bus drivers 372 to 374 which receive the data outputted from input circuits 272 to 274 and output the data to data bus pairs NDB1 to NDB3, respectively, a write data bus driver 375 which receives the data outputted from input circuit 275 and selectively outputs the data to data bus pair NDB4 or a data bus pair WTDB2 in accordance with multi-bit test mode signal TMBT, and write data bus drivers 376 to 378 which receive the data outputted from input circuit 276 to 278 and which output the data to data bus pairs NDB5 to NDB7, respectively.

Semiconductor memory device 11 also includes a write data inversion circuit 60 which partially inverts the write data received from write data bus driver 371 in accordance with an internal signal WDCNV0 and which writes the data to data bus pairs TDB0 to TDB3, and a write data inversion circuit 62 which partially inverts the write data received from write data bus driver 375 in accordance with an internal signal WDCNV1 and which writes the data to data bus pairs TDB4 to TDB7. Internal signals WDCNV0 and WDCNV1 are generated by a test mode control circuit 64 to be described later.

Since data bus pairs NDB0 to NDB3 and TDB0 to TDB3, switches S1 to S4, input/output control circuits 341 to 344 and sense amplifiers SA0 to SA3 are already described with reference to FIG. 2, they will not be repeatedly described herein.

Further, in semiconductor memory device 11, a section which constitutes input circuits 271 to 274 to sense amplifiers SA0 to SA3 and a section which constitutes input circuits 275 to 278 to sense amplifiers SA4 to SA7 are equal in circuit configuration. Therefore, data bus pairs NDB4 to NDB7 and TDB4 to TDB7, switches S5 to S8, input/output control circuits 345 to 348 and sense amplifiers SA4 to SA7 will not be repeatedly described herein.

In the normal operation mode, write data bus drivers 371 to 378 receive the write data, which input circuits 271 to 278 receive, from input circuits 271 to 278, and output the write data to data bus pairs NDB0 to NDB7, respectively. Switches S1 to S8 connect data bus pairs NDB0 to NDB7 to input/output control circuits 341 to 348 in accordance with multi-bit test mode signal TMBT, respectively, and the write data is written from data bus pairs NDB0 to NDB7 to the memory cells of memory cell array MA through input/output control circuits 341 to 348 and sense amplifiers SA0 to SA7, respectively.

In the multi-bit test mode, the degenerated write data is inputted to only input circuits 271 and 275. Write data bus driver 371 outputs the write data received from input circuit 271 to data bus pair WTDB1, and write data bus driver 375 outputs the write data received from input circuit 275 to data bus pair WTDB2 in accordance with multi-bit test mode signal TMBT.

Write data inversion circuit 60 receives the write data from write data bus driver 371 through data bus pair WTDB1, and inverts the logic levels of the write data outputted to data bus pairs TDB1 and TDB2 if the logic level of internal signal WDCNV0 is at H level. In addition, write data inversion circuit 62 inverts the logic levels of the write data outputted to data bus pairs TDB5 and TDB6 if the logic level of internal signal WDCNV1 is at H level.

Switches S1 to S8 connect data bus pairs TDB0 to TDB7 to input/output control circuits 341 to 348, respectively, in accordance with multi-bit test mode signal TMBT. The write data is written in parallel to memory cell array MA from data bus pairs TDB0 to TDB7 through input/output control circuits 341 to 348 and sense amplifiers SA0 to SA7, respectively.

Referring to FIG. 13, semiconductor memory device 11 in the second embodiment includes a test mode control circuit 64 which receives an external test pattern setting signal A9, internal test pattern setting signals TMBTA, TMBTB and TMBTC and which generates internal signals WDCNV0 and WDCNV1 and multi-bit test mode signal TMBT.

Internal test pattern setting signal TMBTB is a signal which logic level becomes H level if semiconductor memory device 11 is in a multi-bit test mode and internal test pattern setting signal TMBTB is set by a control command. External test pattern setting signal A9 is set from the outside of the device as a signal for designating a write data pattern and inputted into the address terminal corresponding to address signal A9 in the normal operation mode. Internal test pattern setting signals TMBTA and TMBTC are internal signals for designating a write data pattern and set by a control command.

In semiconductor memory device 11 in the second embodiment, a terminal which is newly employed to designate the write data pattern is only one terminal for inputting external test pattern setting signal A9. A plurality of write data patterns are realized by combinations of the logic levels of external test pattern setting signal A9 and internal test pattern setting signals TMBTA and TMBTC.

FIGS. 14 to 18 are circuit diagrams showing the circuit configuration of test mode control circuit 64.

Figure 14:
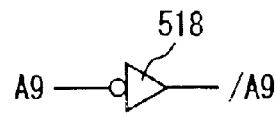
FIG. 14 is a first circuit diagram showing the circuit configuration of a test mode control circuit shown in FIG. 13.

Referring to FIG. 14, test mode control circuit 64 includes an inverter 518 which receives and inverts external test pattern setting signal A9 and outputs an internal signal /A9.

Figure 15:
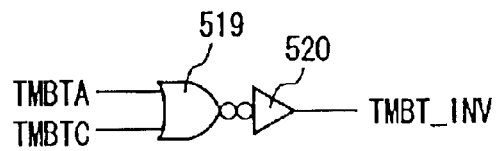
FIG. 15 is a second circuit diagram showing the circuit configuration of the test mode control circuit shown in FIG. 13.

Referring to FIG. 15, test mode control circuit 64 also includes a NOR gate 519 which receives internal test pattern setting signals TMBTA and TMBTC, and an inverter 520 which receives and inverts the output of NOR gate 519 and outputs an internal signal TMBT_INV.

Figure 16:
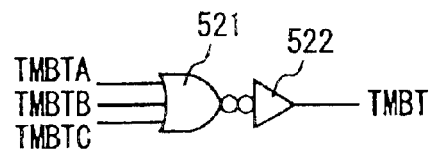
FIG. 16 is a third circuit diagram showing the circuit configuration of the test mode control circuit shown in FIG. 13.

Referring to FIG. 16, test mode control circuit 64 also includes a NOR gate 521 which receives internal test pattern setting signals TMBTA, TMBTB and TMBTC, and an inverter 522 which receives and inverts the output of NOR gate 521 and outputs multi-bit test mode signal TMBT.

The logic level of internal signal TMBT_INV becomes H level if that of either internal test pattern setting signal TMBTA or TMBTC is H level. The logic level of multi-bit test mode signal TMBT becomes H level if that of at least one of internal test pattern setting signals TMBTA, TMBTB and TMBTC is H level.

Further, referring to FIG. 17, test mode control circuit 64 also includes an EXOR gate 523 which receives internal test pattern setting signal TMBTA and external test pattern setting signal A9, and a NAND gate 524 which receives the output of EXOR gate 523 and internal signal TMBT_INV and outputs internal signal WDCNV0.

The logic level of internal signal WDCNV0 becomes H level if internal signal TMBT_INV is at H level and the logic level of external test pattern setting signal A9 is set to be equal to that of internal test pattern setting signal TMBTA, and becomes L level if internal signal TMBT_INV is at H level and the logic level of external test pattern setting signal A9 is set differ from that of internal test pattern setting signal TMBTA.

Referring to FIG. 18, test mode control circuit 64 further includes an AND gate 525 which receives internal signal /A9 and internal test pattern setting signal TMBTC, an AND gate 526 which receives external test pattern setting signal A9 and internal test pattern setting signal TMBTA, a NOR gate 527 which receives the outputs of AND gates 525 and 526, and an inverter 528 which receives and inverts the output of NOR gate 527 and outputs internal signal WDCNV1.

The logic level of internal signal WDCNV1 becomes H level if internal test pattern setting signal TMBTA is at H level and the logic level of external test pattern setting signal A9 is set at H level or if internal test pattern setting signal TMBTC is at H level and the logic level of external test pattern setting signal A9 is set at L level.

FIG. 19 is a view which shows the logic level states of internal signals WDCNV0 and WDCNV1 outputted from test mode control circuit 64 formed of the circuits shown in FIGS. 14 to 18 in accordance with the logic levels of internal test pattern setting signals TMBTA and TMBTC and external test pattern setting signal A9.

Referring to FIG. 19, test mode control circuit 64 sets four possible write data patterns according to combinations of the logic levels of internal signals WDCNV0 and WDCNV1, to write data inversion circuits 60 and 62. In addition, write data inversion circuits 60 and 62, which receive internal signals WDCNV0 and WDCNV1, respectively, invert the logic levels of data of two bits out of the data of four bits written in parallel to memory cell array MA if the logic level of received internal signal WDCNV0 or WDCNV1 is H level.

FIGS. 20 to 23 are views which visually show write data patterns set by test mode control circuit 64. In FIGS. 20 to 23, it is indicated that the data written by the sense amplifier in black is data which logic level is inverted by data write inversion circuit 60 or 62.

Figure 20:
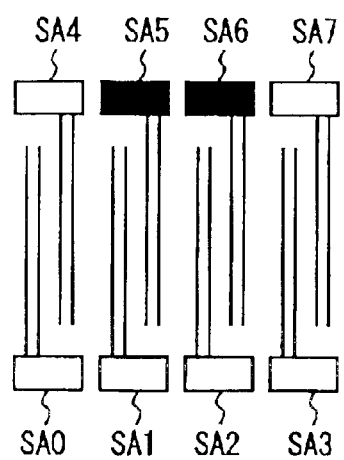
FIG. 20 is a view which visually shows a first write data pattern set by the test mode control circuit shown in FIG. 13.

Referring to FIG. 20, in the first pattern, the logic levels of internal signals WDCNV0 and WDCNV1 become L level and H level, respectively, and the data written from sense amplifiers SA5 and SA6 are inverted by write data inversion circuit 62.

Figure 21:
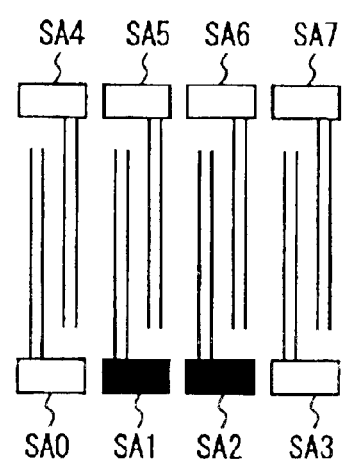
FIG. 21 is a view which visually shows a second write data pattern set by the test mode control circuit shown in FIG. 13.

Referring to FIG. 21, in the second pattern, the logic levels of internal signals WDCNV0 and WDCNV1 become H level and L level, respectively, and the data written from sense amplifiers SA1 and SA2 are inverted by write data inversion circuit 60.

Figure 22:
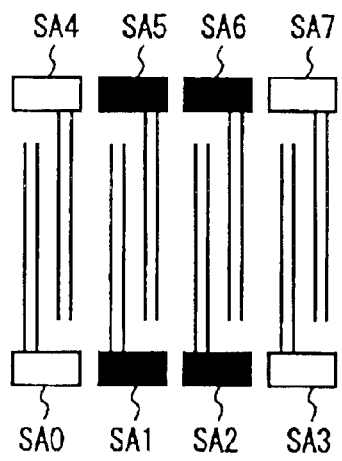
FIG. 22 is a view which visually shows a third write data pattern set by the test mode control circuit shown in FIG. 13.

Referring to FIG. 22, in the third pattern, both of the logic levels of internal signals WDCNV0 and WDCNV1 become H level, and the data written from sense amplifiers SA1, SA2, SA5 and SA6 are inverted by write data inversion circuits 60 and 62.

Figure 23:
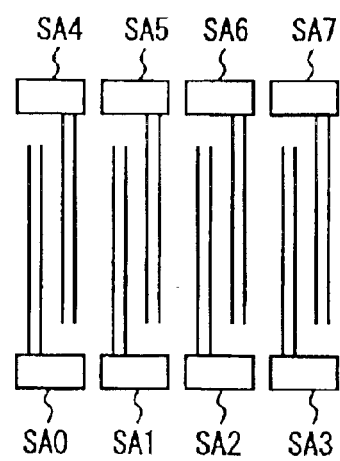
FIG. 23 is a view which visually shows a fourth write data pattern set by the test mode control circuit shown in FIG. 13.
Figure 24:
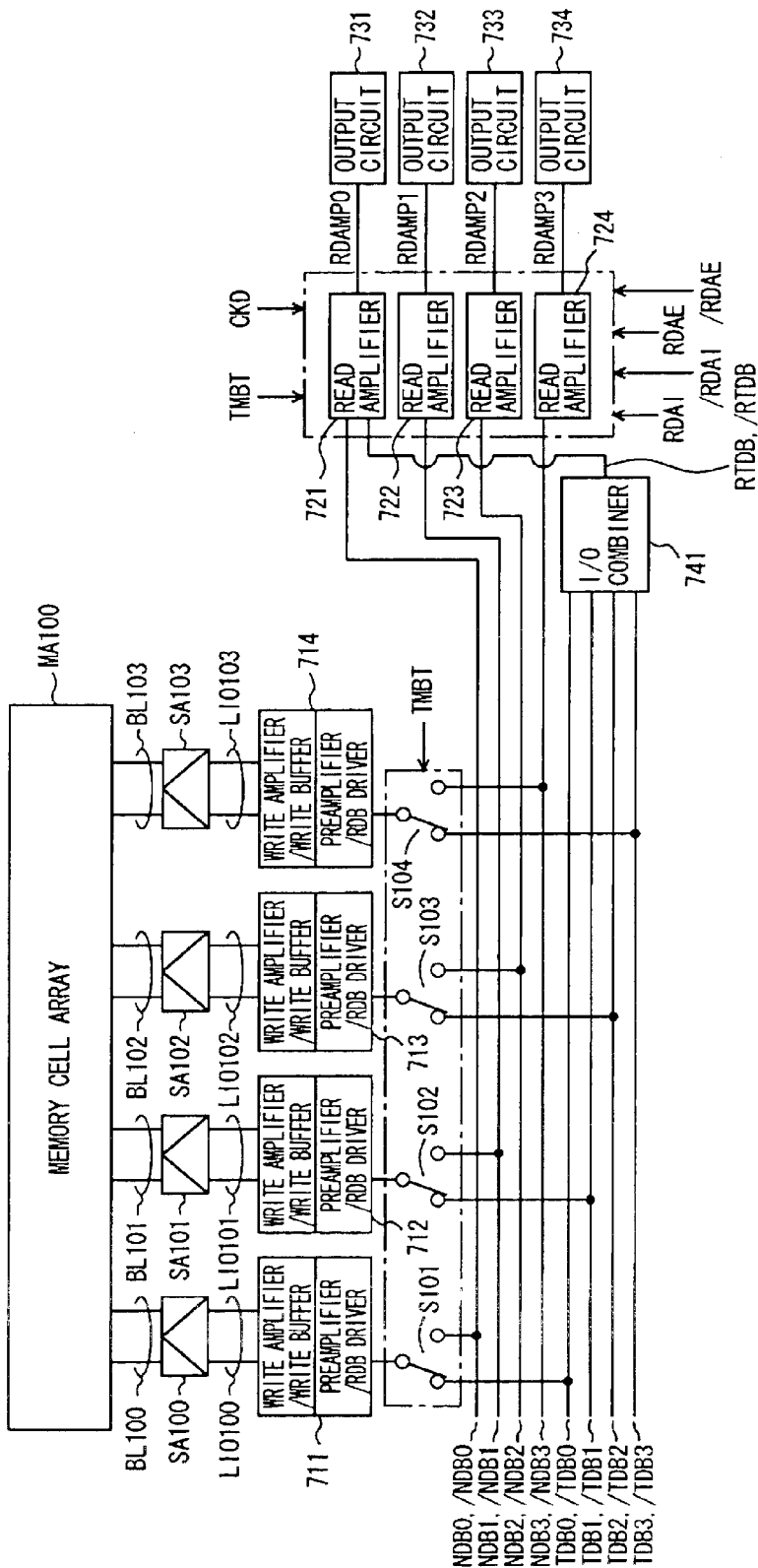
FIG. 24 is a functional block diagram for functionally describing data-read-related sections of a conventional semiconductor memory device having a multi-bit testing function.
Figure 25:
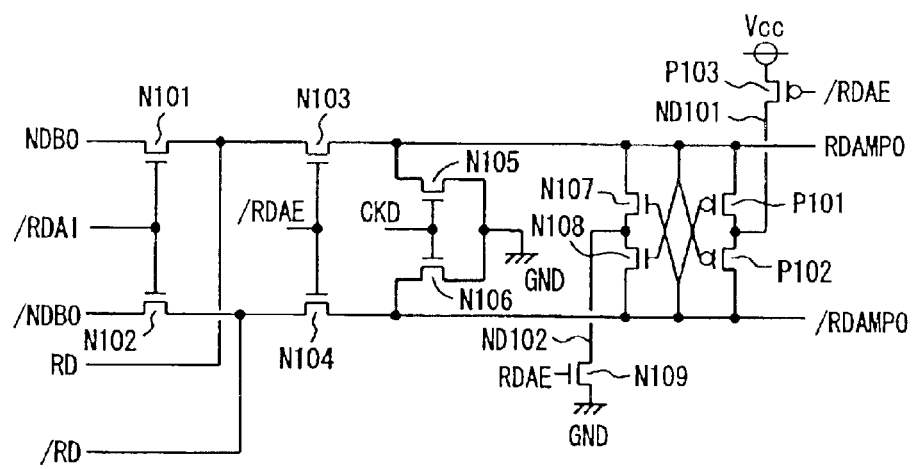
FIG. 25 is a first circuit diagram for describing the circuit configuration of a read amplifier shown in FIG. 24.
Figure 26:
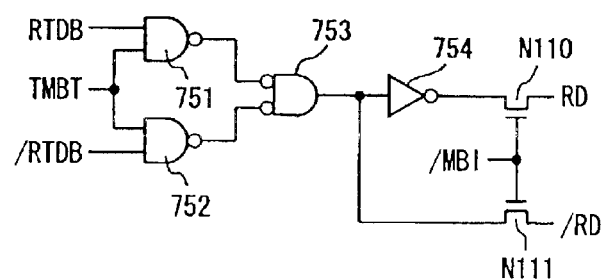
FIG. 26 is a second circuit diagram for describing the circuit configuration of the read amplifier shown in FIG. 24.
Figure 27:
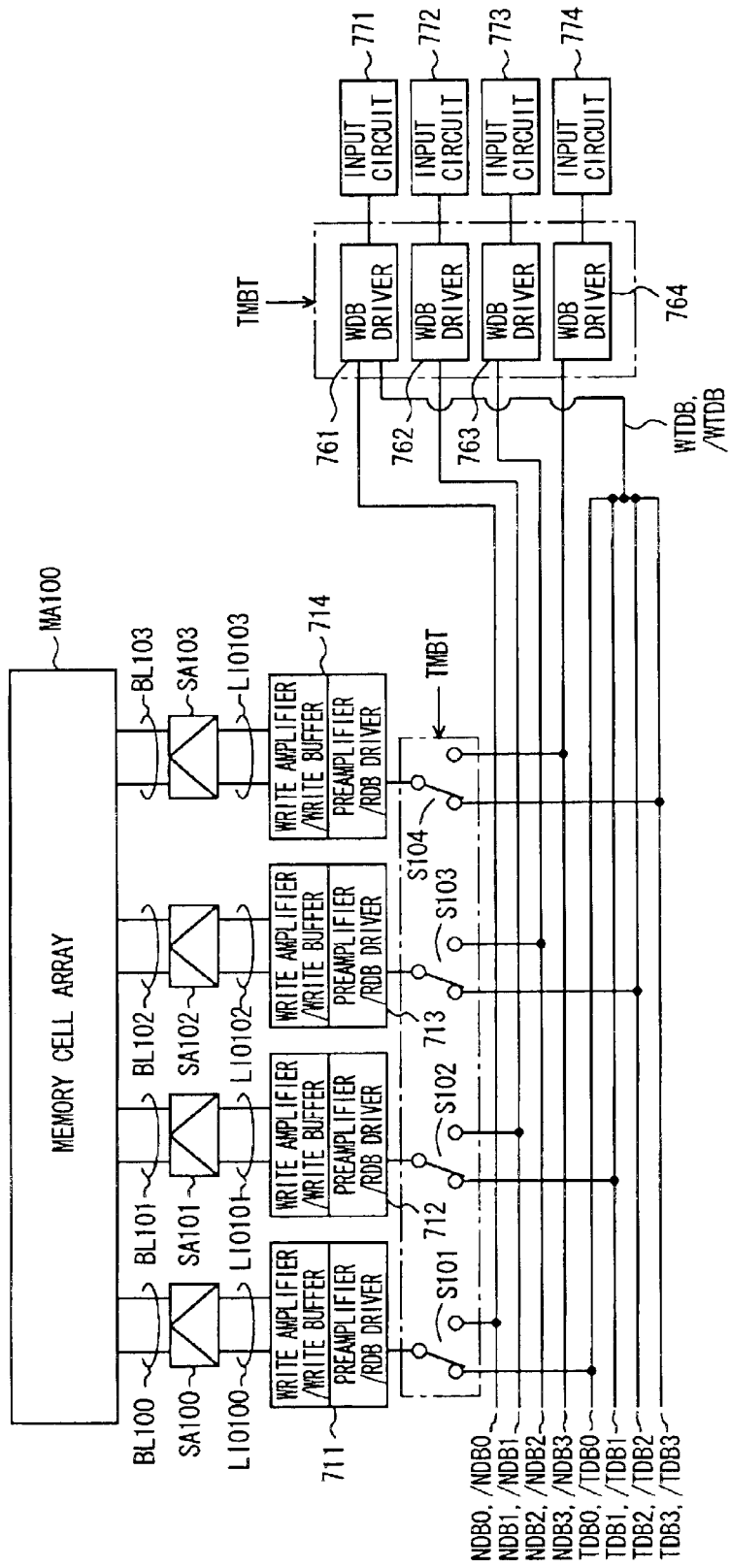
FIG. 27 is a functional block diagram for functionally describing data-write-related sections of a conventional semiconductor memory device having a multi-bit testing function.

Referring to FIG. 23, in the fourth pattern, both of the logic levels of internal signals WDCNV0 and WDCNV1 become L level and none of the data are inverted.

In the second embodiment, write data inversion circuits 60 and 62 invert the logic levels of the data of two bits among the write data of four bits written in parallel to memory cell array MA in accordance with internal signals WDCNV0 and WDCNV1, respectively. However, the inversion patterns are not limited to the above-described patterns but the other data may be inverted.

Furthermore, although not shown in the drawings, semiconductor memory device 11 also includes a read data inversion circuit which inverts the logic level of the data inverted and written data by write data inversion circuits 60 and 62 for the data read from memory cell array MA in parallel during the multi-bit test. The read data outputted from the read data inversion circuit is outputted to I/O combiner 50 and a multi-bit test determination is made by the read amplifier.

As described above, according to semiconductor memory device 11 in the second embodiment, a part of the write data can be inverted in the multi-bit test. It is, therefore, possible to write a plurality of write data patterns and to realize a multi-bit test, such as an inter-bit-lines interference test, having a higher defect detection capability.

Further, according to semiconductor memory device 11 in the second embodiment, it is possible to generate a minimum of four write data patterns which are required by employing only one new terminal. Therefore, the number of terminals employed is minimized and the defect detection capability enhances, whereby it is possible to enhance the testing efficiency as a whole.

Semiconductor memory devices 10 and 11 in the first and second embodiments are synchronous semiconductor memory devices. However, applicable semiconductor memory devices may include asynchronous semiconductor memory devices and double-rate synchronous semiconductor memory devices.

In the first and second embodiments, the number of bits degenerated in the multi-bit test is four. However, the number is not limited to four but more bits may be degenerated.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a memory cell array for storing data;
   a determination circuit for receiving expected value data for logic levels of read data of a plurality of bits read in parallel from said memory cell array, and determining whether the logic levels of said read data coincide with a logic level of said expected value data in a multi-bit test;
   an output circuit for outputting a determination result of said determination circuit;
   an input circuit for receiving degenerated data obtained by degenerating write data of a plurality of bits written in parallel to said memory cell array;
   a test mode control circuit for generating a write data pattern signal for said write data of the plurality of bits on the basis of an internal test pattern setting signal generated internally;
   a write data inversion circuit for inverting logic level of a part of said write data of the plurality of bits written in parallel to said memory cell array on the basis of said write data pattern signal in said multi-bit test; and
   a read data inversion circuit for re-inverting the logic level of the data the logic level of which is inverted by said write data inversion circuit for said read data of the plurality of bits read in parallel from said memory cell array, and outputting the re-inverted read data of the plurality of bits to said determination circuit.

2. The semiconductor memory device according to claim 1, wherein
   said determination circuit determines whether a logic level of degenerated data obtained by degenerating said read data of the plurality of bits coincides with the logic level of said expected value data.

3. The semiconductor memory device according to claim 2, further comprising:
   a degeneration circuit for degenerating said read data of the plurality of bits, and outputting said degenerated data; and
   a read amplifier for amplifying a signal level of received data, and outputting the data to said output circuit, wherein
   said read amplifier amplifies the signal level of read data read from said memory cell array and outputs the read data to said output circuit when the semiconductor memory device operates normally, and
   said read amplifier receives said degenerated data outputted from said degeneration circuit and outputs the determination result of said determination circuit to said output circuit in said multi-bit test.

4. The semiconductor memory device according to claim 3, wherein
   said degeneration circuit outputs said degenerated data indicating a first degeneration result when all of the logic levels of said read data of the plurality of bits read in parallel from said memory cell array are a first logic level, outputs said degenerated data indicating a second degeneration result when all of the logic levels of said read data of the plurality of bits read in parallel from said memory cell array are a second logic level, and outputs said degenerated data indicating a third degeneration result when all of the logic levels of said read data of the plurality of bits read in parallel from said memory cell array do not coincide each other, and
   said determination circuit determines that writing/reading of data of said plurality of bits have been normally performed when said degenerated data indicates said first degeneration result and the logic level of said expected value data is said first logic level or when said degenerated data indicates said second degeneration result and the logic level of said expected value data is said second logic level.

5. The semiconductor memory device according to claim 1, wherein
   said expected value data is set from an outside of the semiconductor memory device through one of terminals employed when the semiconductor memory device normally operates.

6. The semiconductor memory device according to claim 1, wherein
   said internal test pattern setting signal is generated internally on the basis of one of a plurality of commands issued to the semiconductor memory device.

7. The semiconductor memory device according to claim 1, wherein
   said test mode control circuit receives an external test pattern setting signal inputted from one predetermined terminal, and generates said write data pattern signal on the basis of said internal test pattern setting signal and said external test pattern setting signal.

* * * * *